(12) United States Patent
Nabicht

(10) Patent No.: US 7,741,914 B1
(45) Date of Patent: Jun. 22, 2010

(54) AMPLIFIER SYSTEM WITH DYNAMICALLY-ADJUSTED SUPPLY VOLTAGE

(75) Inventor: Joseph T. Nabicht, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 12/331,977

(22) Filed: Dec. 10, 2008

(51) Int. Cl.
*H03F 3/04* (2006.01)

(52) U.S. Cl. ........................... 330/297; 330/296

(58) Field of Classification Search ............. 330/297, 330/285, 296
See application file for complete search history.

(56) References Cited

U.S. PATENT DOCUMENTS

| 4,721,919 | A | | 1/1988 | LaRosa et al. | |
|---|---|---|---|---|---|
| 5,289,137 | A | * | 2/1994 | Nodar et al. | 330/296 |
| 6,011,440 | A | * | 1/2000 | Bell et al. | 330/297 |
| 6,614,310 | B2 | | 9/2003 | Quarfoot et al. | |
| 6,937,720 | B2 | | 8/2005 | Casier et al. | |
| 7,276,886 | B2 | | 10/2007 | Kinder et al. | |
| 7,359,682 | B2 | | 4/2008 | Yoon | |
| 7,609,114 | B2 | * | 10/2009 | Hsieh et al. | 330/297 |

OTHER PUBLICATIONS

T. Samei, et al., "Highest Efficiency and Super Quality Audio Amplifier Using MOS Power FET's in Class G Operation," IEEE Trans. Consumer Electron., vol. CE-24, Aug. 1978, pp. 300-307 (Best available copy—marked-up by unknown person).

* cited by examiner

*Primary Examiner*—Henry K Choe
(74) *Attorney, Agent, or Firm*—William B. Kempler; Wade J. Brady, III; Frederick J. Telecky, Jr.

(57) ABSTRACT

An amplifier system may include an output stage configured to provide an amplified output signal at an output thereof based on an input signal, the output stage being connected between first and second supply voltages. A dynamic power supply control system provides the first and second supply voltages, the dynamic power supply being configured to adjust the first and second supply voltages as a function of the input signal such that a difference between the first and second supply voltages remains substantially constant.

20 Claims, 4 Drawing Sheets

US 7,741,914 B1

AMPLIFIER SYSTEM WITH DYNAMICALLY-ADJUSTED SUPPLY VOLTAGE

TECHNICAL FIELD

This invention relates to electronic circuits, and more particularly to an amplifier system with a dynamically adjusted supply voltage.

BACKGROUND

Various types of amplifier topologies have been designed to function in a variety of classifications. For example, a Class A amplifier conducts signal current throughout the cycle of the signal waveform (e.g., providing 360° conduction). A Class B amplifier Conducts signal current for exactly one-half of the cycle of the input-signal waveform (e.g., providing 180° conduction). A class AB amplifier generally corresponds to a Class-B amplifier with bias designed to avoid cross-over distortion.

A Class-D amplifier is an electronic amplifier which, in contrast to the active load used in linear mode AB-class amplifiers, uses the switching mode of transistors to regulate power delivery. This feature enables the Class-D amplifier to achieve high power conversion efficiency. For instance, Class D amplifiers use pulse width modulation (PWM), pulse density modulation (sometimes referred to as pulse frequency modulation) or other forms of advanced forms of modulation, such as sigma-delta modulation. A drawback of the Class D amplifier, however, is that very large FET sizes are typically required to achieve high efficiencies and to lower the resistance at turn on.

There are efforts to develop other higher efficiency amplifiers, including Class G and H amplifiers. These amplifier designs seek to combine a class AB output stage with other techniques to realize higher power efficiency with low distortion. The terms "Class G" and "Class H" are used somewhat interchangeably to refer to different designs, varying in definition from one manufacturer or publication to another. Class G amplifiers are a more efficient version of class AB amplifiers by employing "rail switching" to reduce power consumption and raise efficiency. The topology utilizes two or more power rails at different voltage levels and switches between this rails as the signal output approaches each level. Thus an AB amp design can increase in efficiency by reducing the wasted power at the output transistors from a larger than required voltage rail. Class H amplifiers operate by continuously boosting and lowering the supply, as required, above a certain minimum bias level.

Despite the advances made with Class G and H amplifiers, there is still a need for more efficient amplifier designs.

SUMMARY

This invention relates to electronic circuits, and more particularly to an amplifier system with a dynamically adjusted supply voltage.

One embodiment of the invention relates to an amplifier system that includes an output stage configured to provide an amplified output signal at an output thereof based on an input signal, the output stage being connected between first and second supply voltages. A dynamic power supply control system provides the first and second supply voltages, the dynamic power supply being configured to adjust the first and second supply voltages as a function of the input signal such that a difference between the first and second supply voltages remains substantially constant.

Another embodiment of the invention relates to an amplifier system that includes core amplifier circuitry, such as may be configured according to a desired amplifier classification type. A driver that provides a driver control signal based on an input signal to be amplified, the driver providing the driver control signal according to the classification type of the core amplifier circuitry. An output stage of the core circuitry is configured to provide an amplified output signal at an output thereof based on the driver control signal. The output stage is connected between first and second supply voltages. A detector is coupled to monitor the input signal and provide a detector signal that represents a level of the input signal. A dynamic power supply provides the first and second supply voltages based on the detector signal. The dynamic power supply is configured to continuously adjust the first and second supply voltages based on the detector signal while maintaining a substantially constant difference between the first and second supply voltages. The dynamic power supply can adjust the first and second supply voltages relative to minimum positive and negative bias levels of the dynamic power supply.

Another embodiment of the invention relates to a method for amplifying an input signal to provide a corresponding output signal as an amplified version of the input signal. The method can include driving core amplifier circuitry with a driver signal to cause output stage to supply current relative to an output thereof. The output stage is connected between first and second supply voltages, with an intermediate node of the output stage defining the output. The first and second supply voltages are continuously modulated as a function of the input signal while maintaining a substantially constant difference between the first and second supply voltages.

DETAILED DESCRIPTION

The present invention relates to an amplifier system that affords high efficiency with low distortion relative to many other amplifier designs. An amplifier system is provided with adjustable supply voltages that are modified as a function of an input signal such that a difference between the respective supply voltage remains substantially constant. An output stage of the amplifier structure is connected between the respective supply voltages. The core amplifier structure can be configured according to various amplifier topologies, such as Class A, Class B or Class AB topologies, and can be biased with a minimum voltage level to reduce power consumption and to increase efficiency that is delivered to the corresponding load. This approach also mitigates distortion by modifying supply rails in way to provide a more suitable bias to the core amplifier circuitry.

As used herein, the term "substantially" is intended to convey that variations may exist, such as tend to occur in any practical application. For example, the phrase "substantially constant" as applied to the difference between supply voltages does allow for some variations, such as may be due to process variations, temperature or other practical constraints associated with implementing an amplifier circuit, but the difference would otherwise be designed to remain fixed. Additionally, the difference between supplies may be different for different minimum bias levels of the amplifier, such that the difference, while substantially constant, may nonetheless be different for different operating conditions.

Figure 1:
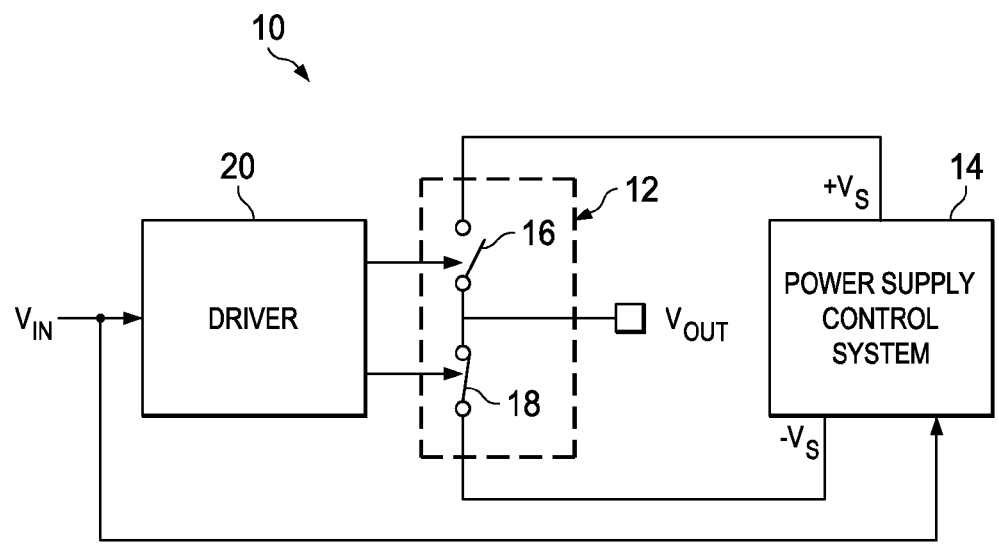
FIG. 1 depicts an example of an amplifier system that can be implemented in accordance with an aspect of the invention.

FIG. 1 depicts a block diagram of an amplifier system 10 that can be implemented according to an aspect of the invention. The amplifier 10 includes an output stage 12 that is connected between first and second supply voltages, such as positive and negative supply voltages, demonstrated as voltage supply rails $+V_S$ and $-V_S$. A power supply control system 14 is configured to provide the respective supply voltages to the output stage 12. The power supply control system 14 of FIG. 1 can be implemented as analog circuitry, digital circuitry or a combination of analog and digital circuitry that is configured to provide the adjustable supply voltages $+V_S$ and $-V_S$ to bias the output stage 12 of the amplifier. The output stage 12 is depicted as a pair of switches 16 and 18 connected between the positive and negative supply voltages plus $+V_S$ and $-V_S$. A driver 20 is connected to drive the respective switches 16 and 18 according to an input signal $V_{IN}$. The supply rails for the amplifier 10 and the output stage 12 could be the same or different depending on the topology of the cores amplifier circuitry and design specifications.

The input voltage $V_{IN}$ is also provided to the power supply control system 14. The power supply control system 14 is configured to adjust the respective supply voltages $+V_S$ and $-V_S$ in a complementary manner as a function of the input signal $V_{IN}$. For instance, the dynamic power supply control varies the supply voltages $+V_S$ and $-V_S$ according to the level of the input signal $V_{IN}$ while maintaining a substantially constant difference between the respective supply voltages. The difference between the magnitudes of the respective supply voltages can be considered a common mode voltage for the amplifier system 10. Those skilled in the art will understand and appreciate various ways in which the level of the input signal may be tracked to in turn modulate or adjust the supply voltages that are provided to the output stage 12. In one example, the power supply control system 14 continuously modulates each of the supply voltages $+V_S$ and $-V_S$ over time as a function of the input signal $V_{IN}$ that is being amplified (e.g., by attenuating the input voltage $V_{IN}$ to provide an analog ground reference for the power supply control system). As used herein, the term "continuously" in the context of power supply modulation is intended to encompass discrete or incremental adjustments over time as well as smooth continuous changes over time.

As a further example, the power supply control system 14 can include timing circuitry that is utilized to ensure that the adjustments to the supply voltages, which are made as a function of the input signal $V_{IN}$, are adjusted to the appropriate level in synchronization with the amplification of the input signal. For instance, control signals can be delayed in the path of the power supply control system 14 to ensure that the supply voltages have ample time to adjust upward and downward commensurate with changes in the desired output voltage. Such delay thus affords adequate headroom in the supply rails to mitigate clipping in the output voltage $V_{OUT}$. Those skilled in the art will understand and appreciate various other types of circuitry and configurations that can be utilized as means to perform the functionality of the power supply control system 14, such as those shown and described herein.

Figure 2:
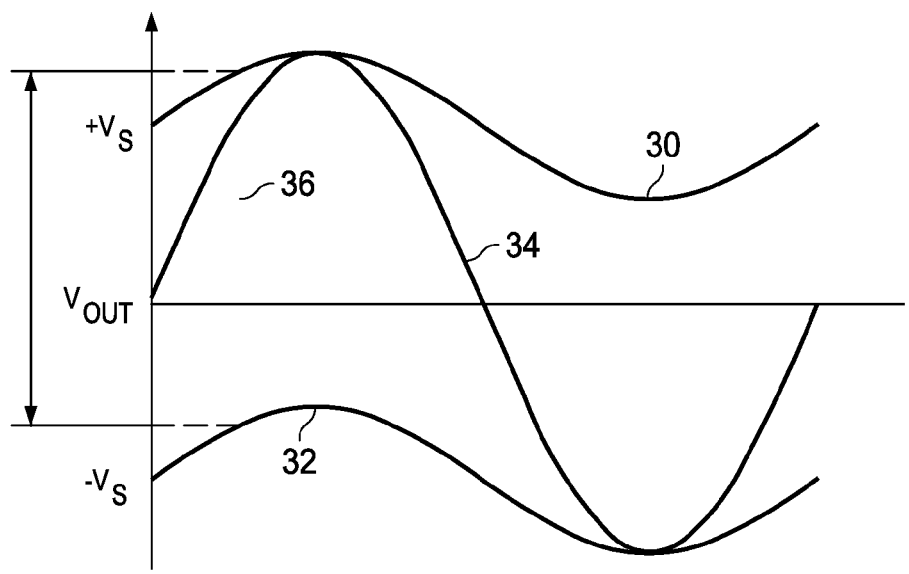
FIG. 2 depicts an example of supply voltage and output voltage waveforms that can be provided using an amplifier according to an aspect of the invention.

FIG. 2 depicts an example of waveforms from the example of FIG. 1 in which $+V_S$ is indicated at 30 and $-V_S$ is indicated at 32. The output voltage is indicated at 34 and is designated $V_{OUT}$. $V_{OUT}$ can be provided to a load corresponding to an amplified version of the input signal $V_{IN}$. As depicted in FIG. 2, a difference between the respective supply voltages $+V_S$ and $-V_S$ remains substantially constant over time, as indicated at 36. While the example of FIG. 2 demonstrates a sinusoidal output waveform for the output load $V_L$ and each of the respective supply voltages 30 and 32, it is to be understood and appreciated that the supply voltages and output waveform are not intended to be limited to a sinusoidal type waveform. For example, the supply voltages can be modulated as different types of waveforms in which the difference between supply voltages remains substantially constant over time. For example, the power supply control system 14 (FIG. 1) can provide the supply voltages $+V_S$ and $-V_S$ as square waveforms, a saw type waveforms or other type of waveform that vary over time.

Figure 3:
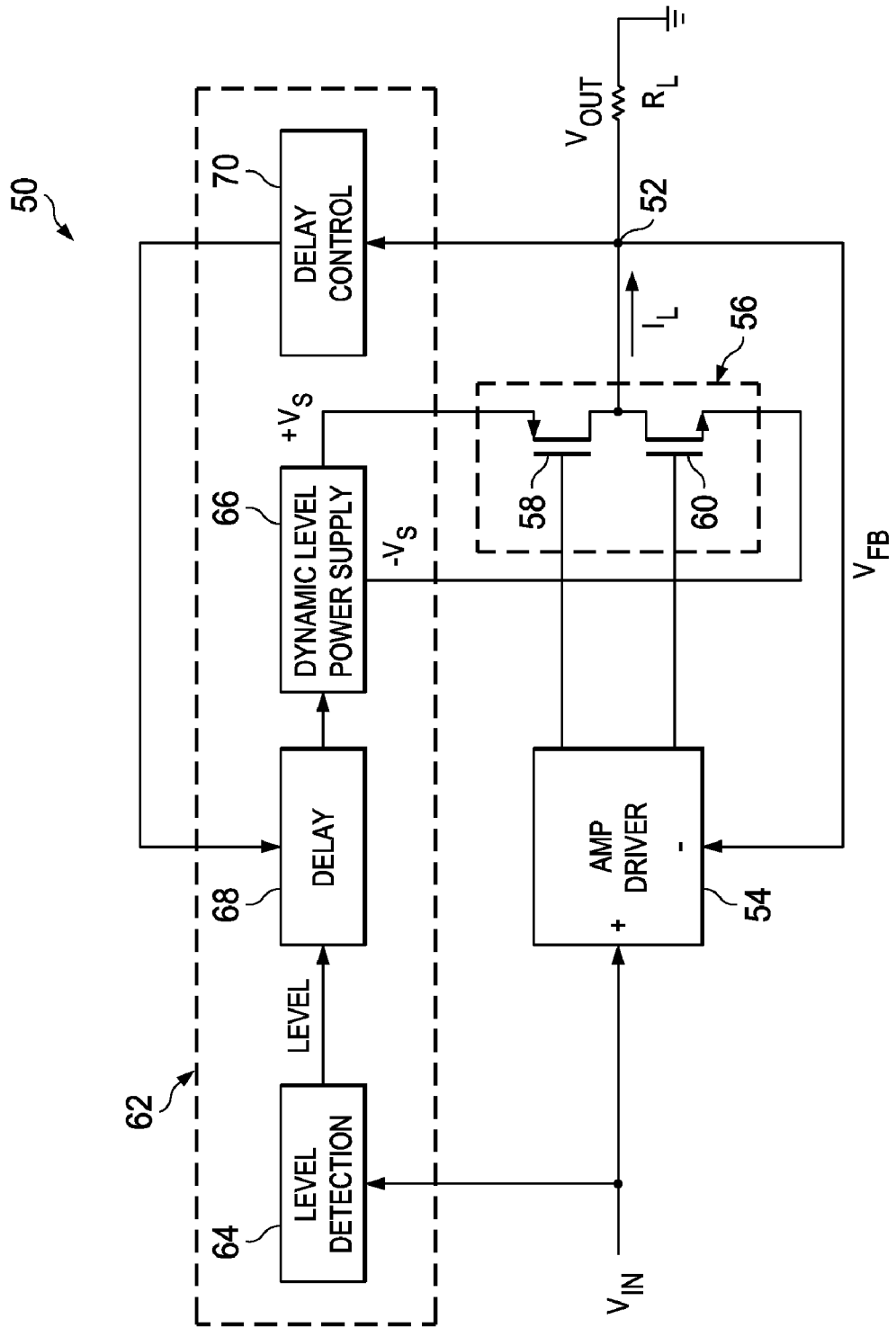
FIG. 3 depicts an example of an amplifier system with a dynamically adjusted voltage bias that can be implemented according to an aspect of the invention.

FIG. 3 depicts an example of an amplifier system 50 that can be implemented according to an aspect of the invention. The amplifier system 50 is configured to amplify an input signal, indicated at $V_{IN}$, and to provide a corresponding output voltage, indicated at $V_{OUT}$, at an output 52. For instance, the output voltage is provided across a load, demonstrated as a resistance $R_L$. The amplifier system 50 includes an amplifier driver 54 that receives the input signal $V_{IN}$ and provides one or more control signals to a corresponding output stage, indicated at 56. The supply voltages $+V_S$ and $-V_S$ thus are modulated to track the input voltage $V_{IN}$.

By way of example, the output stage 56 includes a PFET (p-type field effect transistor) 58 an NFET (n-type field effect transistor) 60 connected in series between first and second supply voltages, indicated at $+V_S$ and $-V_S$. An intermediate node between the PFET 58 and the NFET 60 defines the output 52 of the amplifier system 50. The amplifier driver 54 provides the control signals to the gates of the respective output FETs 58 and 60 for controlling the output stage 56 according to the type of amplifier being implemented. For example, the amplifier system can be configured as a Class A, Class B or Class AB amplifier to name a few different possible amplifier types.

As a further example, the amplifier driver 54 can be implemented as including an operational amplifier having a non-inverting input that receives the input voltage $V_{IN}$ and an inverting input at which a feedback voltage $V_{FB}$, corresponding to the voltage $V_L$ at the output 52, is provided. In response to the $V_{IN}$ and $V_{FB}$, the amplifier driver 54, in turn, generates the control signals for controlling the output stage 56. As mentioned above, the control of the output stage may vary according to the type of core amplifier being implemented. Accordingly, different types of driver circuitry can be utilized depending on the types of core amplifier circuitry implemented in the amplifier system 50.

A power supply control system 62 is configured to dynamically adjust the supply voltages $+V_S$ and $-V_S$ as a function of the input signal $V_{IN}$ while maintaining a substantially constant difference between the respective supply voltages. The power supply control system 62 can be implemented as including analog circuitry, digital circuitry or a combination of analog and digital circuitry.

In the example of FIG. 3, the power supply control system 62 includes a level detection circuitry 64 that provides an LEVEL signal corresponding to the detected level of the input signal $V_{IN}$. The level detection circuitry 64 can be implemented as a digital or analog comparator. As one example, the level detection circuitry 64 can comprise an analog-to-digital converter (ADC) that is configured to convert the analog input signal $V_{IN}$ to a discrete value LEVEL that represents the level of the input signal $V_{IN}$. A dynamic level power supply 66 thus can utilize the LEVEL signal for performing dynamic adjustments of the voltage rail bias levels of the supply voltages $+V_S$ and $-V_S$, such as described herein.

In FIG. 3, a delay circuitry 68 can be provided in the signal path between the level detection circuitry 64 and the dynamic level power supply 66. The delay circuitry 68 is provided to ensure that the adjustments to the voltage rail bias levels for $+V_S$ and $-V_S$ of the amplifier system 50 are synchronized with the activation and deactivation of the amplifier output stage 56. The delay circuitry 68 thus is synchronized with the input signal being amplified to help ensure that the output voltage $V_{OUT}$ provided at the output 52 is not clipped due to insufficient supply voltages at the respective rails. In order to ensure that the adjustments to the voltage rails $+V_S$ and $-V_S$ are substantially synchronized with the amplification of the input signal at the output stage 56, the system can include delay control circuitry 70. For instance, the delay control circuitry 70 can monitor the output voltage $V_{OUT}$ and provide a phase control signal to the delay circuitry 68. The delay circuitry 68 thus can implement an appropriate amount of delay with respect to the adjustments to the supply voltages $+V_S$ and $-V_S$, so that the power supply rails are not adjusted prematurely. For example, the delay circuitry 68 can provide a variable amount of delay in response to a delay control signal from the delay control block 70 so that the delay circuit 68 provides an amount of delay that is commensurate with the delay experienced by the input signal $V_{IN}$ to the signal path of the amplifier driver 54. The delay control 70 thus helps ensure that the power supply rails do not prematurely decrease during a high amplitude output and clip the output waveform and further do not prematurely increase during a low (e.g., negative) amplitude output so as to clip the output waveform at 52.

Those skilled in the art will understand and appreciate various types of circuitry that can be utilized to implement the adjusted variable amount of delay for the delay circuit 68, such as including digital delay lines, buffers, digital logic elements, or an analog delay line such as in the form of electrical components connected in series and that the variable adjustments may be made by controlling the number of elements connected in the delay line.

In one exemplary implementation, the supply rails $+V_S$ and $-V_S$ can be biased with a minimum level according to the amplifier topology being utilized for the driver 54 and the output stage 56. The power supply control system 62 can adjust the voltage rail bias levels of each of the voltage rails $+V_S$ and $-V_S$ simultaneously and continuously over time to maintain a substantially constant difference level between the respective supply voltages. In this way, the amplifier system 50 can achieve an increased efficiency as well as a decreased amount of distortion which is desirable in many applications, including audio amplifiers and the like.

Figure 4:
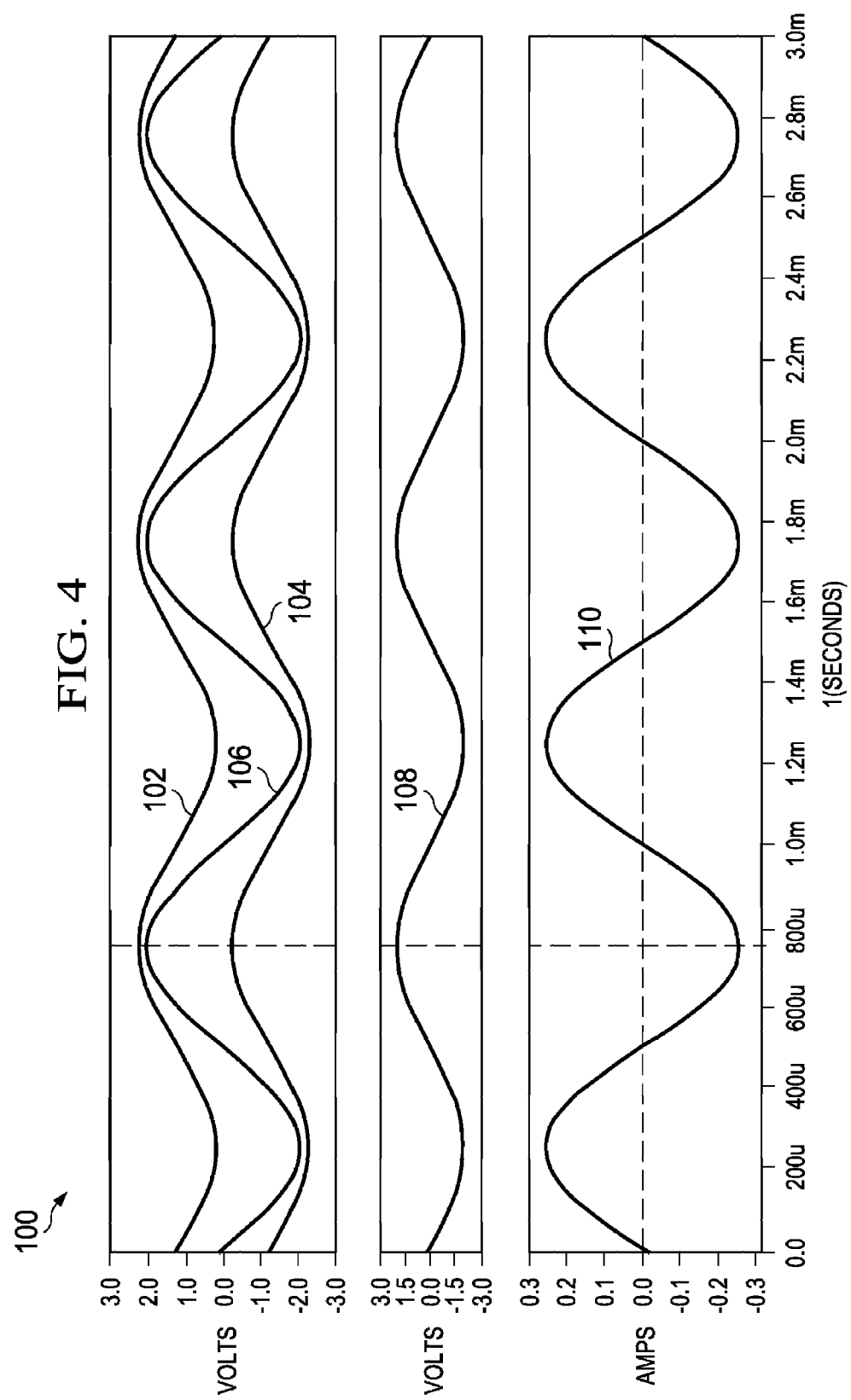
FIG. 4 depicts a signal diagram depicting example waveforms from the system of FIG. 3.

FIG. 4 depicts an example of a signal diagram 100 associated with operation of the amplifier system 50 of FIG. 3. Accordingly reference may be made back to FIG. 3 for additional context in relation to the signal diagram 100. As shown in FIG. 4, the positive voltage rail is depicted at 102 and the corresponding negative voltage rail is depicted at 104. In the example of FIG. 4, the positive voltage rail and the negative voltage rail are modulated continuously over time such that the difference between the level of the respective rails remains substantially constant at approximately 2.5 volts. Each of the positive voltage rail 102 and the negative voltage rail 104 are modulated to track the input signal, indicated at 106. For example, the positive rail 102 is continuously modulated from a minimum bias level (e.g., 0.25 volts) up to about 2.25 volts as a function of the input signal 106. Similarly, the negative rail 104 is continuous modulated below the minimum negative bias level (e.g., about −0.25 volts) to about −2.25 volts as a function of the level of the input signal 106.

A corresponding output voltage signal, indicated at 108, is provided at the output of the amplifier system. As described herein, the adjustments to the supply voltages are synchronized with the control for the output voltage to provide ample headroom to mitigate clipping of the output signal. Thus, due to the modulation of the supply voltages 102 and 104, which track the input voltage 106, the supply voltages 102 and 104 are controlled so as to have peaks and valleys commensurate with respective peaks and valleys of the output voltage 108. Such phasing synchronization mitigates clipping in the output voltage.

The signal diagram 100 also depicts the output current as a function of the time as indicated at 110. From simulations under ideal conditions, it can be demonstrated that the power efficiency of the amplifier system can be comparable the efficiency of a Class G amplifier. Additionally, the amplifier system 50 exhibits better distortion characteristics (e.g., reduced total harmonic distortion) relative to other amplifier designs. The reduced distortion results at least in part because the supply rails are modified in a less abrupt manner than other rail switching amplifier topologies (e.g., the Class G and H amplifiers) and thus allows a more suitable bias to the core amplifier circuitry over a wider range than other types of amplifiers.

Figure 5:
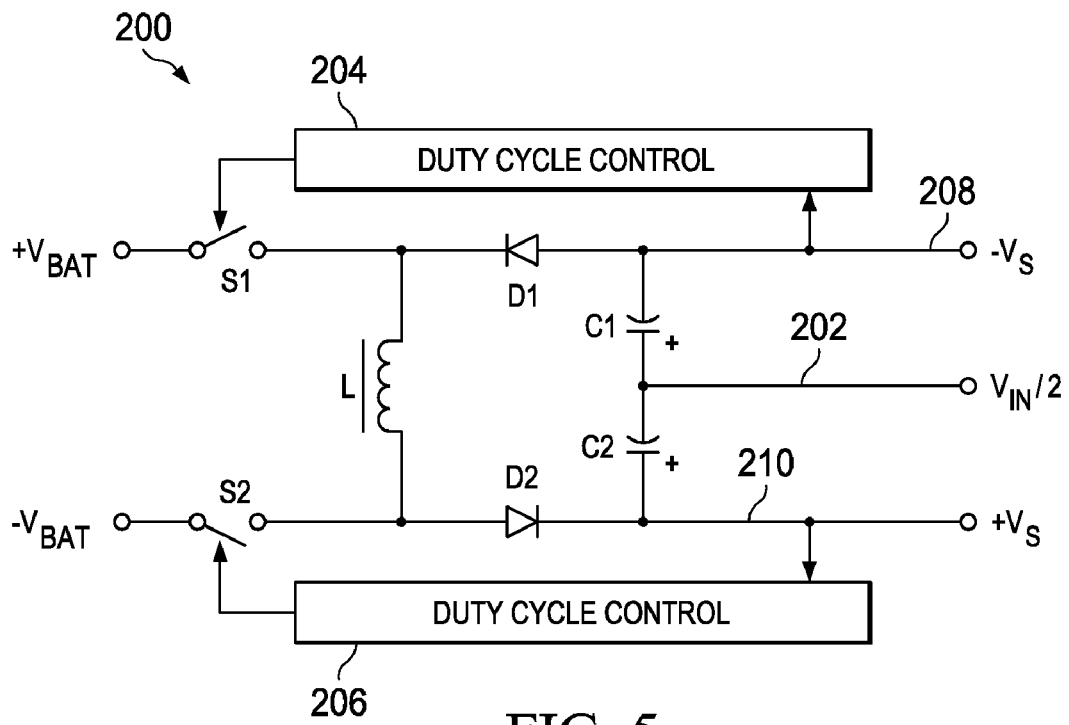
FIG. 5 depicts an example of a dynamic level power supply that can be utilized in an amplifier that is implemented according to an aspect of the invention.

FIG. 5 depicts an example of a dynamic power supply system 200 that can be utilized to generate the modulated power supply voltages $+V_S$ and $-V_S$ for use in an amplifier system described herein (See, e.g., FIGS. 1 and 3). The power supply system 200 can be implemented based on a single inductor buck converter design in which a midpoint voltage at node 202 of the supply system is modulated as a function of the input signal $V_{IN}$. For instance, an analog ground reference is provided based on the input voltage $V_{IN}$, such as attenuating the amplitude of $V_{IN}$. In the example of FIG. 5, the midpoint node 202 is modulated according to $V_{IN}/2$. For instance, the input voltage at node 202 can be obtained via a voltage divider circuit (not shown) and provided as a corresponding input to the dynamic level power supply system 200.

As depicted, positive and negative battery voltages, indicated at $+V_{BAT}$ and $-V_{BAT}$, are provided at inputs of respective switches S1 and S2. The switches S1 and S2 can be implemented, for example, as FETs or other types of transistors. The duty cycle control networks 204 and 206 are configured to control each of the respective switches S1 and S2 to supply a desired amount of the positive and negative battery voltage to corresponding supply rails 208 and 210, respectively. An inductor having an inductance, indicated at L, is connected between the respective rails 208 and 210. Additionally, a pair of capacitor C1 and C2 are connected in series between the respective voltage rails 208 and 210. An intermediate node between the respective capacitor C1 and C2 defines the input 202 at which the fractional portion of the input signal (e.g., $V_{IN}/2$) can be provided. For instance, the capacitors can be matched to maintain a substantially constant voltage difference between the node 202 and each of the respective rails 208 and 210.

A first diode D1 is connected between the power supply rail 208 and the switch S1. The diode thus is connected to permit current flow from the negative supply voltage $-V_S$ and through the inductor L. Another diode D2 is connected between the switch S2 and the positive supply voltage rail 210. The diode D2 thus permits current from the switch S2 to the positive supply rail 210.

The duty cycle control networks 204 and 206 thus can be programmed control the amount of battery voltage that is applied to the system 200 and thereby establish the voltage range the supply voltages at the respective rails 208 and 210. Examples of the duty cycle control 204 and 206 are set forth in greater detail in U.S. Pat. No. 7,276,886, which is incorporated herein by reference. Those skilled in the art will understand and appreciate that the dynamic power supply system 200 is but one example of a circuit that can be utilized to modulate the supply voltages for an amplifier system shown and described herein. Thus a single inductor dual output power supply system thus provides a low cost example for the modulated power supply.

Figure 6:
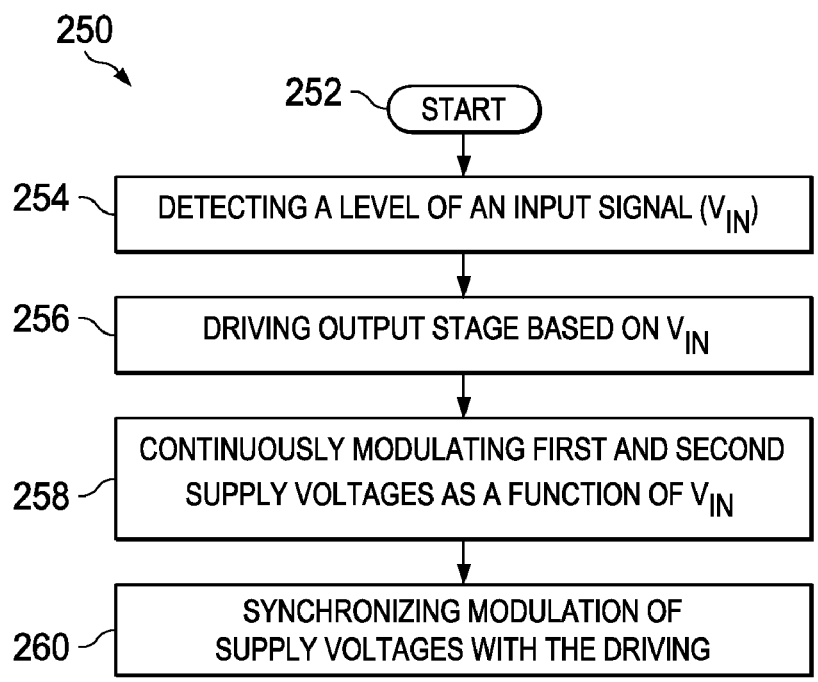
FIG. 6 is a flow diagram depicting a method for amplifying an input signal according to an aspect of the invention.

In view of the structural and functional features described above, certain methods will be better appreciated with reference to FIG. 6. It is to be understood and appreciated that the illustrated actions, in other embodiments, may occur in different orders or concurrently with other actions demonstrated FIG. 6. Moreover, not all features may be required to implement a method according to the subject invention. It is to be further understood that certain features, as will be evident to one skilled in the art, can be implemented in hardware (e.g., as analog or digital circuitry, a controller or FPGA), software (e.g., stored in a computer readable medium or as executable instructions running on one or more processor or controllers), or as a combination of hardware and software.

FIG. 6 depicts an example method 250 that can be employed for amplifying an input signal to provide a corresponding output signal as an amplified version of the input signal. The method can be implemented by the circuitry shown and described herein. The method begins at 252, such as at power-up in which minimum bias levels and reference levels are set to their starting values.

At 254, a level of the input signal is detected to provide a level signal indicative of the detected level of the input signal $V_{IN}$. At 256, driving core amplifier circuitry is driven with a driver signal to cause output stage to supply current relative to a load which is coupled to an output thereof. The output stage is connected between first and second supply voltages, with an intermediate node of the output stage defining the output of the amplifier. The first and second supply voltages are modulated as a function of the input signal while maintaining a substantially constant difference between the first and second supply voltages. As described herein, the modulation of the supply voltages can be continuous over time. At 260, the modulation of the first and second supply voltages is synchronized with the driving of the core amplifier circuitry to mitigate clipping of the output signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An amplifier system comprising:
an output stage configured to provide an amplified output signal at an output thereof based on an input signal, the output stage being connected between first and second supply voltages; and
a dynamic power supply control system that provides the first and second supply voltages, the dynamic power supply being configured to adjust the first and second supply voltages as a function of the input signal such that a difference between the first and second supply voltages remains substantially constant.

2. The system of claim 1, wherein dynamic power supply is configured to continuously adjust each of the first and second supply voltages while maintaining the difference between the first and second supply voltages substantially constant.

3. The system of claim 1, wherein the difference between the first and second supply voltages is equal to an adjustable reference voltage that is functionally related to the input signal.

4. The system of claim 1, wherein the dynamic power supply control system further comprises level detection circuitry configured to detect a level of the input signal and provide a level signal that represents the detected level of the input signal, the dynamic power supply adjusting the first and second supply voltages depending on the level signal.

5. The system of claim 4, wherein the dynamic power supply control system further comprises further comprising delay circuitry, the delay circuitry imposing a time delay with respect to adjustments to the first and second supply voltages to mitigate clipping of the output voltage.

6. The system of claim 5, wherein the dynamic power supply control system further comprises a delay control circuit configured to monitor the output voltage and provide a control signal to the delay circuitry, the delay circuitry implementing the time delay to vary based on the control signal from the delay control circuit.

7. The system of claim 1, wherein the dynamic power supply control system further comprises a dynamic power supply having an input that receives a corresponding input signal that is a proportional to the input signal, circuitry is connected between the input of the dynamic power supply and each of first and second voltage rails to allow the voltage potential between the input of the dynamic power supply and each respective voltage rails to vary depending on the input signal and to maintain the voltage potential between the respective voltage rails at a substantially constant level, each of the first and second rails defining a respective one of the first and second supply voltages.

8. The system of claim 7, wherein the corresponding input signal of the dynamic power supply is approximately one-half of the input signal.

9. The system of claim 1, further comprising:
an output stage coupled between the first and second supply voltages; and
an amplifier driver coupled to control the output stage in response to the input signal.

10. The system of claim 9, wherein the amplifier driver is configured to control the output stage as one of a Class A, Class B, Class AB amplifier.

11. An amplifier system comprising:
core amplifier circuitry comprising:
a driver that provides a driver control signal based on an input signal to be amplified, the driver providing the driver control signal according to the classification type of the core amplifier circuitry; and an output stage configured to provide an amplified output signal at an output thereof based on the driver control signal, the output stage being connected between first and second supply voltages; and a detector coupled to monitor the input signal and provide a detector signal that represents a level of the input signal;

a dynamic power supply that provides the first and second supply voltages based on the detector signal, the dynamic power supply being configured to continuously adjust the first and second supply voltages based on the detector signal while maintaining a substantially constant difference between the first and second supply voltages, the first and second supply voltages being adjusted relative to minimum positive and negative bias levels of the dynamic power supply.

12. The system of claim 11, wherein the substantially constant difference between the first and second supply voltages is equal to a programmable fixed reference voltage.

13. The system of claim 11, further comprises further comprising delay circuitry, the delay circuitry imposing a time delay on the detector signal to synchronize adjustments in the first and second supply voltages with the driver control signal to mitigate clipping of the output voltage.

14. The system of claim 13, further comprises a delay control circuit configured to monitor the output voltage and provide a control signal to the delay circuitry, the delay circuitry imposing an amount of delay that varies based on the control signal from the delay control circuit.

15. The system of claim 11, wherein the dynamic power supply receives a corresponding input signal that is a fractional portion of the input signal, the dynamic power supply comprising circuitry connected between the input of the dynamic power supply and each of first and second voltage rails to allow the voltage potential between the input of the dynamic power supply and each respective voltage rails to vary depending on the level of the input signal and to maintain the voltage potential between the respective voltage rails at a substantially constant level, each of the first and second rails defining a respective one of the first and second supply voltages.

16. The system of claim 11, wherein the driver is configured to control the output stage as one of a Class A, Class B, Class AB amplifier.

17. The system of claim 11, wherein the output stage comprises a half-bridge circuit comprising first and second transistors coupled in series between the first and second supply voltages, a intermediate node between the first and second transistors defining the output of the amplifier system.

18. A method for amplifying an input signal to provide a corresponding output signal as an amplified version of the input signal, the method comprising:

driving core amplifier circuitry with a driver signal to cause output stage to supply current relative to a load which is coupled to an output thereof, the output stage being connected between first and second supply voltages, an intermediate node of the output stage defining the output; and continuously modulating the first and second supply voltages as a function of the input signal while maintaining a substantially constant difference between the first and second supply voltages.

19. The method of claim 18, further comprising detecting a level of the input signal to provide a level signal indicative of the detected level of the input signal, the modulation of the first and second supply voltages being based on the detected level of the input signal.

20. The method of claim 19, wherein the modulation of the first and second supply voltages is synchronized with the driving of the core amplifier circuitry to mitigate clipping of the output signal.

* * * * *